US012696787B2

(12) United States Patent
Takao et al.

(10) Patent No.: US 12,696,787 B2
(45) Date of Patent: Jul. 28, 2026

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Toma Takao, Tokyo (JP); Kosuke Yamaguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 363 days.

(21) Appl. No.: 18/403,875

(22) Filed: Jan. 4, 2024

(65) Prior Publication Data

US 2024/0332242 A1      Oct. 3, 2024

(30) Foreign Application Priority Data

Mar. 28, 2023    (JP) ................................. 2023-051198

(51) Int. Cl.
H10W 72/50      (2026.01)
H10W 72/00      (2026.01)
H10W 90/00      (2026.01)

(52) U.S. Cl.
CPC ......... H10W 72/50 (2026.01); H10W 72/015 (2026.01); H10W 90/753 (2026.01)

(58) Field of Classification Search
CPC . H10W 72/50; H10W 72/015; H10W 90/753; H10W 72/071; H10W 72/07236; H10W 70/65; H10W 70/611; H10W 90/00
See application file for complete search history.

(56) References Cited

U.S. PATENT DOCUMENTS

| | | | | |
|---|---|---|---|---|
| 11,456,244 B2 * | 9/2022 | Ichikawa | ............ | H10W 70/658 |
| 2013/0155745 A1 * | 6/2013 | Tanaka | .................. | H02M 7/537 |
| | | | | 363/131 |

(Continued)

FOREIGN PATENT DOCUMENTS

| | | |
|---|---|---|
| JP | 2013-125806 A | 6/2013 |
| JP | 2014-130909 A | 7/2014 |

(Continued)

OTHER PUBLICATIONS

An Office Action, "Notice of Reasons for Refusal," mailed by the Japanese Patent Office on Jan. 20, 2026, which corresponds to Japanese Patent Application No. 2023-051198 and is related to U.S. Appl. No. 18/403,875; with English language translation.

(Continued)

*Primary Examiner* — Mark W Tornow
(74) *Attorney, Agent, or Firm* — Studebaker Brackett PLLC

(57)      ABSTRACT

A semiconductor device according to the present disclosure includes: a lower arm-side MOSFET; a lower arm-side IGBT; an upper arm-side MOSFET; an upper arm-side IGBT; an upper arm-side IC that controls driving of the upper arm-side MOSFET and the upper arm-side IGBT; a MOSFET gate wire connecting a gate electrode of the upper arm-side MOSFET and the upper arm-side control IC; an IGBT gate wire connecting a gate electrode of the upper arm-side IGBT and the upper arm-side control IC; and an IGBT emitter sense wire directly connecting an emitter electrode of the upper arm-side IGBT and the upper arm-side control IC, and a source electrode of the upper arm-side MOSFET is electrically connected to the upper arm-side control IC via the emitter electrode of the upper arm-side IGBT.

10 Claims, 7 Drawing Sheets

(56)        References Cited

U.S. PATENT DOCUMENTS

| | | | |
|---|---|---|---|
| 2014/0184303 A1* | 7/2014 | Hasegawa ............ | H03K 17/567 |
| | | | 327/377 |
| 2018/0145513 A1* | 5/2018 | Kato ........................ | H02J 4/25 |
| 2021/0354563 A1 | 11/2021 | Miura et al. | |

FOREIGN PATENT DOCUMENTS

| JP | 2017-005089 A | 1/2017 |
|---|---|---|
| JP | 7201066 B2 | 1/2023 |
| WO | 2020/090924 A1 | 5/2020 |

OTHER PUBLICATIONS

An Office Action, "Decision of Refusal," mailed by the Japanese Patent Office on May 12, 2026, which corresponds to Japanese Patent Application No. 2023-051198 and is related to U.S. Appl. No. 18/403,875; with English language translation.

* cited by examiner

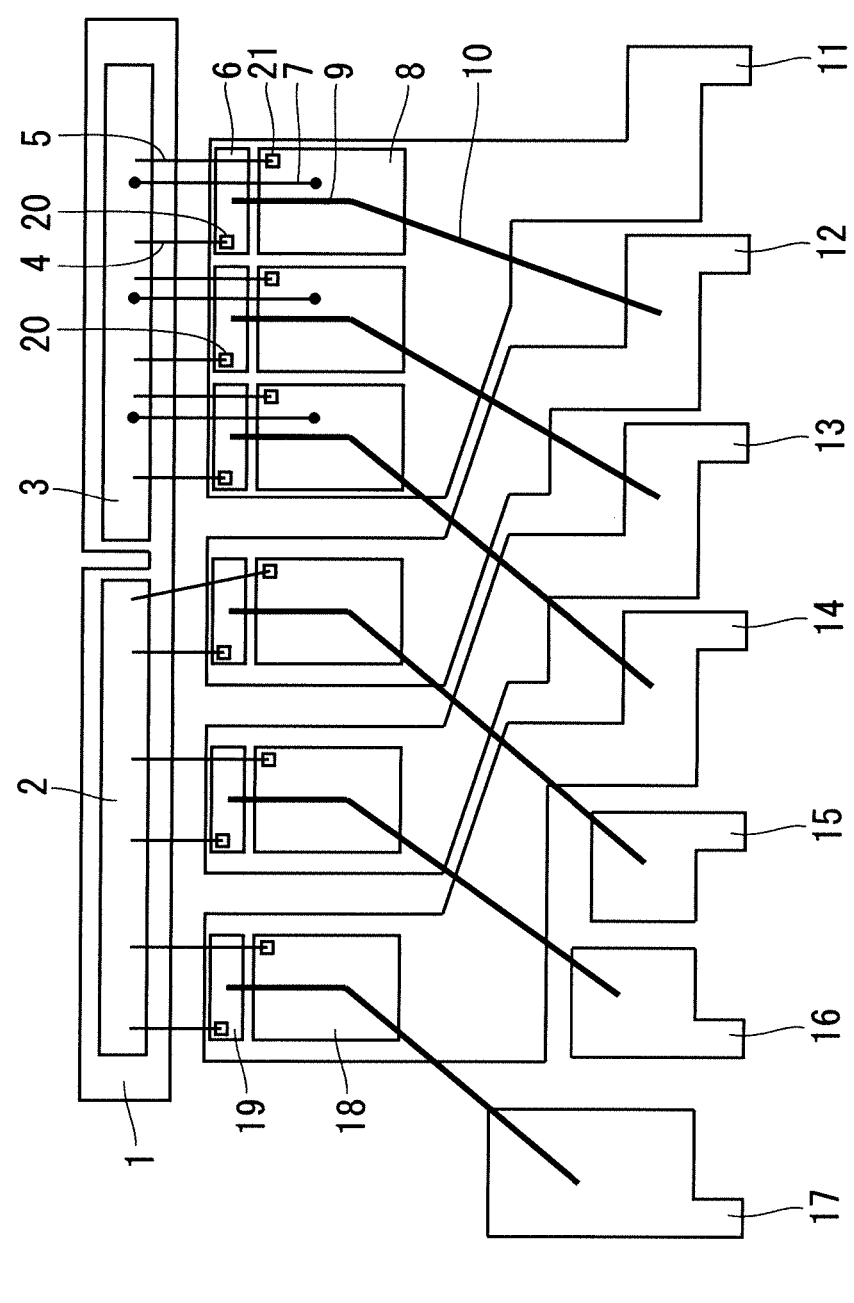
F I G. 1

F I G.  2
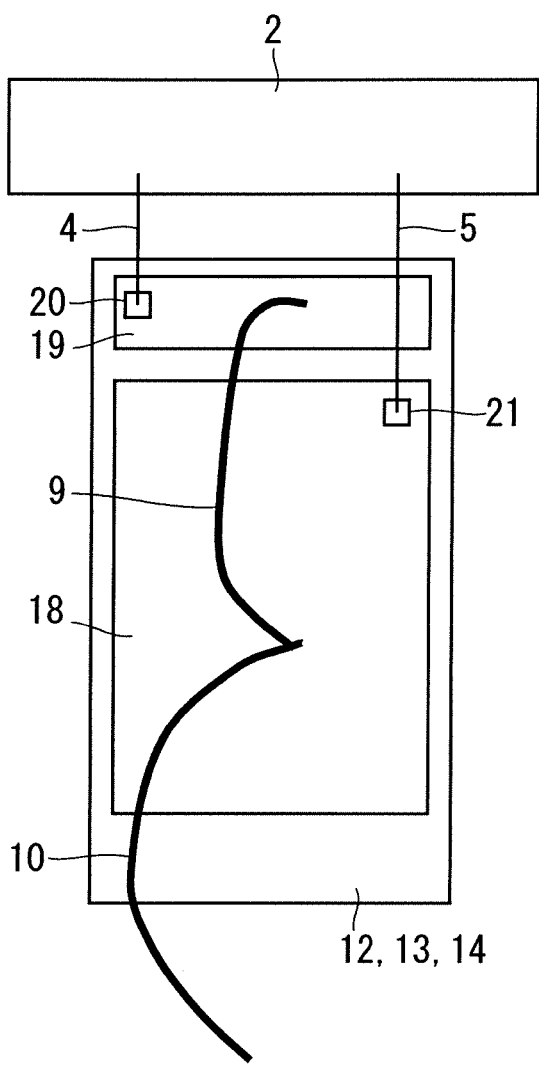

F I G.  3
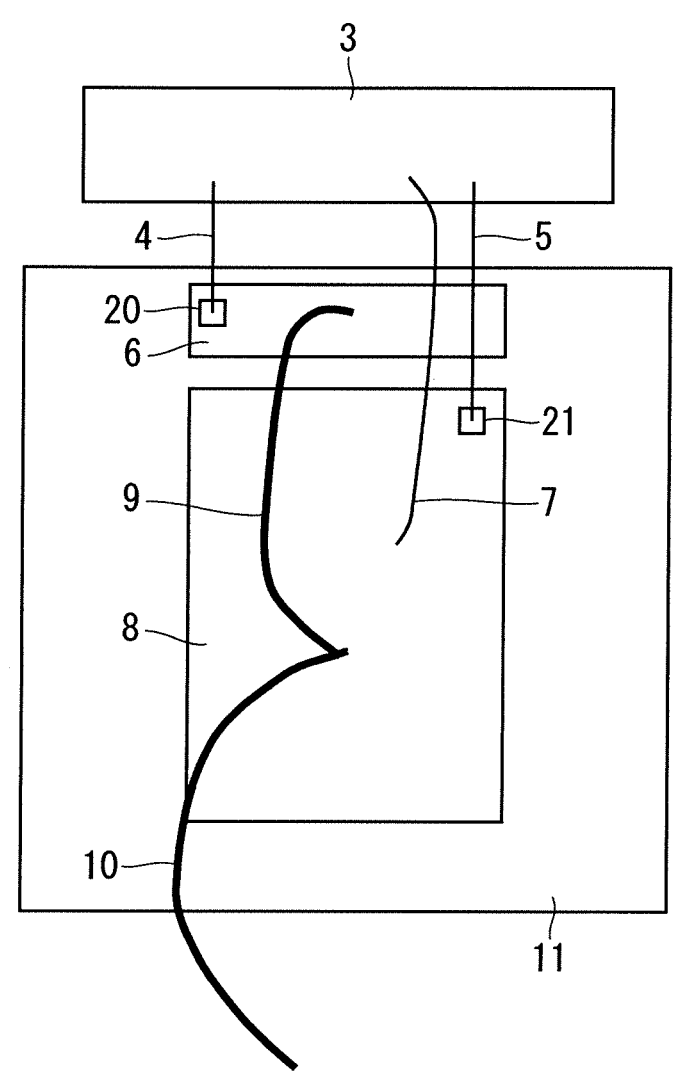

F I G . 4
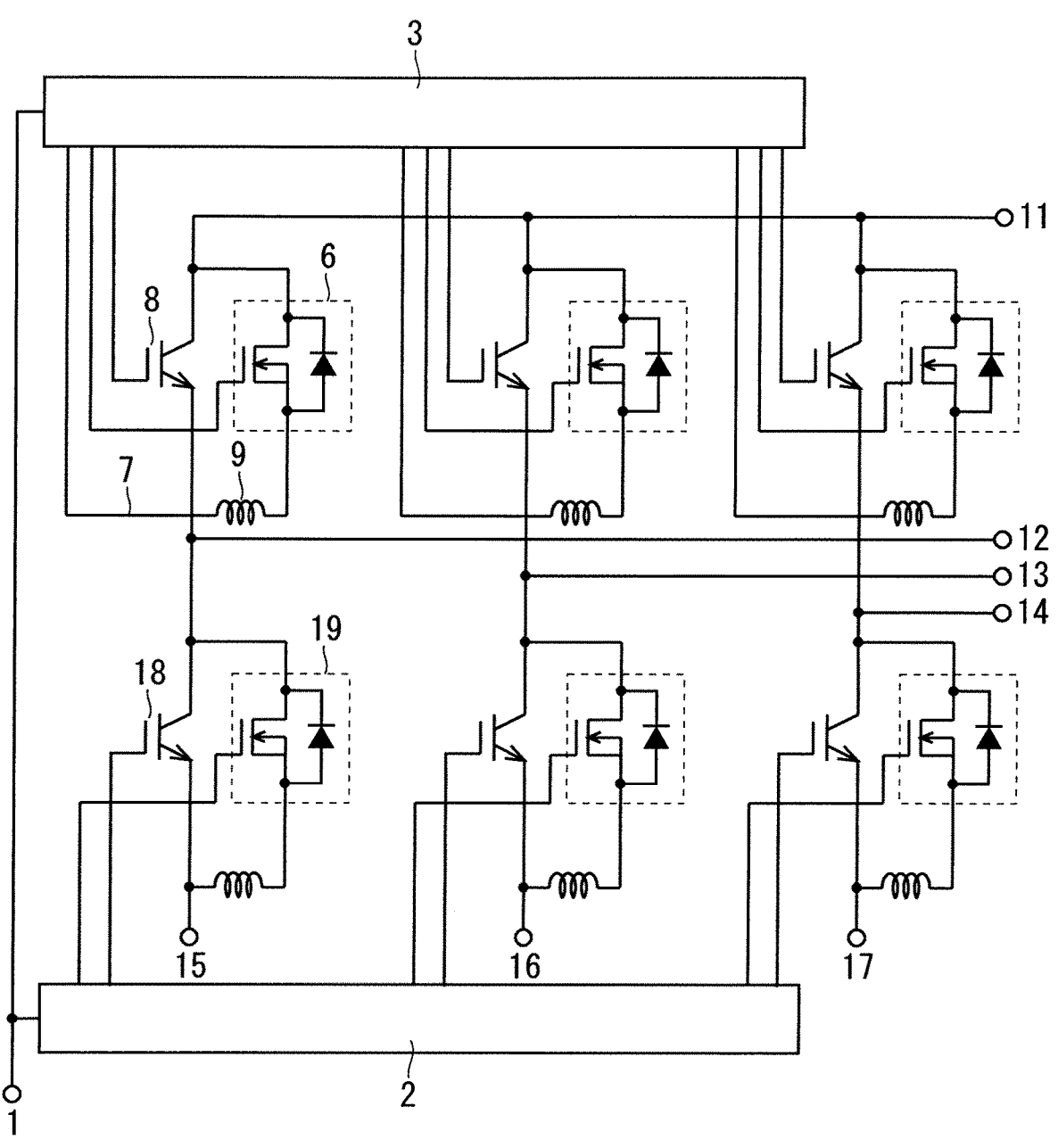

F I G.  5
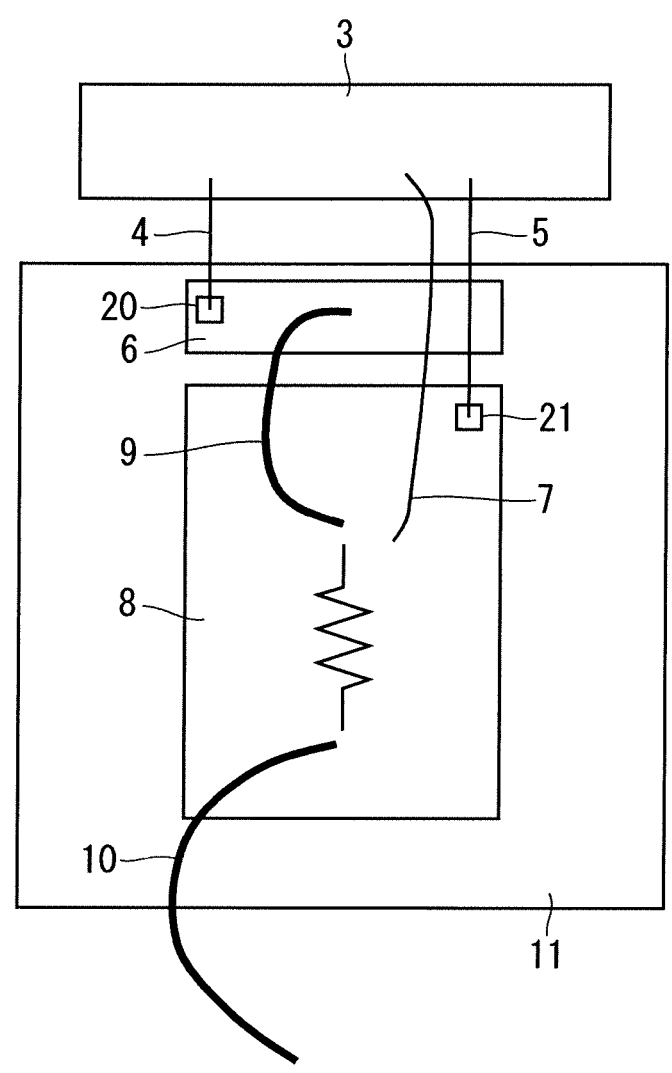

F I G.  6
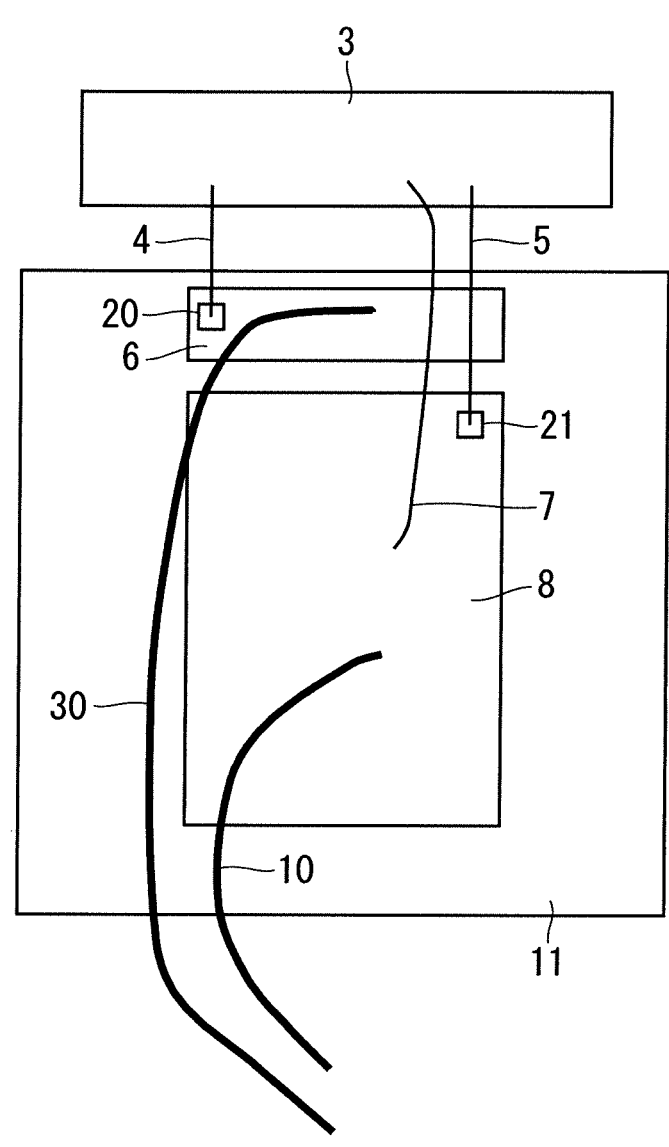

F I G.  7
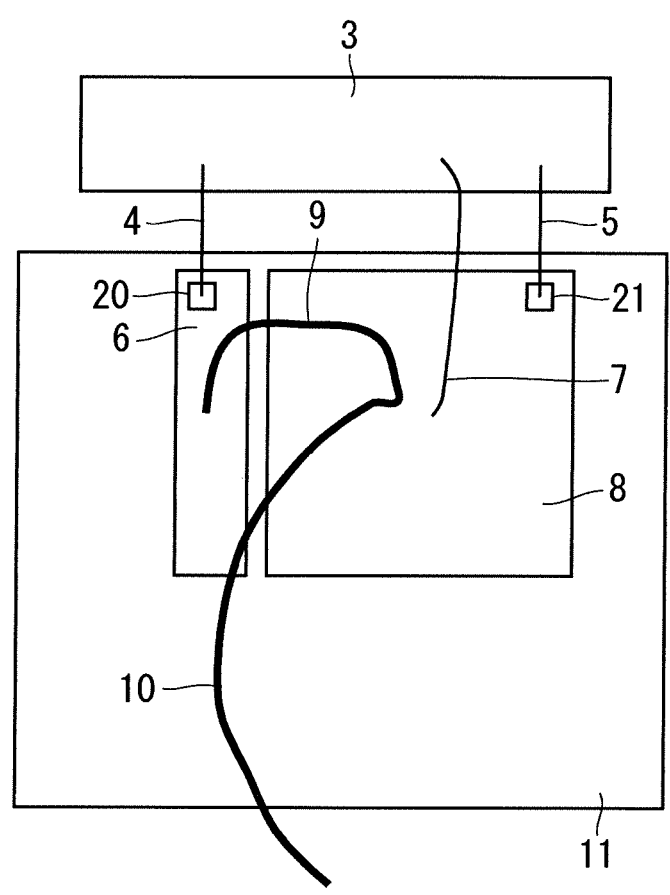

SEMICONDUCTOR DEVICE AND METHOD OF MANUFACTURING SEMICONDUCTOR DEVICE

BACKGROUND OF THE INVENTION

Field of the Invention

The present disclosure relates to a semiconductor device using a MOSFET and an IGBT as switching devices in parallel operation, and a method of manufacturing the semiconductor device.

Description of the Background Art

Conventionally, there has been disclosed a semiconductor device in which a metal-oxide-semiconductor field effect transistor (MOSFET) and an insulated gate bipolar transistor (IGBT) are mounted so as to operate in parallel, and a sense wire is wired from a source electrode of the MOSFET provided near a control integrated circuit (IC) in an upper arm (See, for example, Japanese Patent Application Laid-Open No. 2014-130909).

In Japanese Patent Application Laid-Open No. 2014-130909, since a delay time of the MOSFET is designed to be longer than that of the IGBT by the control IC so that the MOSFET is not broken, there is a problem that characteristics of the MOSFET cannot be sufficiently utilized.

SUMMARY

An object of the present disclosure is to provide a semiconductor device and a method of manufacturing the semiconductor device capable of sufficiently utilizing characteristics of a MOSFET.

A semiconductor device according to the present disclosure includes: a lower arm-side MOSFET; a lower arm-side IGBT connected in parallel with the lower arm-side MOSFET; an upper arm-side MOSFET; an upper arm-side IGBT connected in parallel with the upper arm-side MOSFET; an upper arm-side control IC that controls driving of the upper arm-side MOSFET and the upper arm-side IGBT; a MOSFET gate wire electrically connecting a gate electrode of the upper arm-side MOSFET and the upper arm-side control IC; an IGBT gate wire electrically connecting a gate electrode of the upper arm-side IGBT and the upper arm-side control IC; and an IGBT emitter sense wire electrically directly connecting an emitter electrode of the upper arm-side IGBT and the upper arm-side control IC, wherein a source electrode of the upper arm-side MOSFET is electrically connected to the upper arm-side control IC via the emitter electrode of the upper arm-side IGBT.

According to the present disclosure, characteristics of the MOSFET can be sufficiently utilized.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a plan view illustrating an entire configuration of a semiconductor device according to a first preferred embodiment;

FIG. 2 is a plan view illustrating a configuration of a lower arm of the semiconductor device according to the first preferred embodiment;

FIG. 3 is a plan view illustrating a configuration of an upper arm of the semiconductor device according to the first preferred embodiment;

FIG. 4 is a diagram illustrating a circuit of the semiconductor device according to the first preferred embodiment;

FIG. 5 is a plan view illustrating a configuration of an upper arm of a semiconductor device according to a second preferred embodiment;

FIG. 6 is a plan view illustrating a configuration of an upper arm of a semiconductor device according to a third preferred embodiment; and FIG. 7 is a plan view illustrating a configuration of an upper arm of a semiconductor device according to a fourth preferred embodiment.

DESCRIPTION OF THE PREFERRED EMBODIMENTS

First Preferred Embodiment

FIG. 1 is a plan view illustrating an entire configuration of a semiconductor device according to a first preferred embodiment. FIG. 2 is a plan view illustrating a configuration of a lower arm. FIG. 3 is a plan view illustrating a configuration of an upper arm. FIG. 4 is a diagram illustrating a circuit of the semiconductor device.

As illustrated in FIGS. 1, 2, a U-phase frame 12 is provided with a lower arm-side MOSFET 19 and a lower arm-side IGBT 18 connected in parallel with the lower arm-side MOSFET 19. The lower arm-side MOSFET 19 and the lower arm-side IGBT 18 are formed of silicon.

The lower arm-side MOSFET 19 is provided with a gate pad 20, and a MOSFET gate wire 4 electrically connects the gate pad 20 and a lower arm-side control IC 2. The lower arm-side IGBT 18 is provided with a gate pad 21, and an IGBT gate wire 5 electrically connects the gate pad 21 and a lower arm-side control IC 2. A source-emitter wire 9 electrically connects a source electrode of the lower arm-side MOSFET 19 and an emitter electrode of the lower arm-side IGBT 18. A main current emitter wire 10 electrically connects the emitter electrode of the lower arm-side IGBT 18 and an NU terminal 15. The source-emitter wire 9 and the main current emitter wire 10 are one continuous wire, and a wire welding point (stitch) is formed at a boundary portion between the source-emitter wire 9 and the main current emitter wire 10 (the emitter electrode of the lower arm-side IGBT 18).

In a V-phase frame 13, an emitter electrode of a lower arm-side IGBT 18 and an NV terminal 16 are electrically connected via a main current emitter wire 10. Other configurations are similar to those of the U-phase frame 12.

In a W-phase frame 14, an emitter electrode of a lower arm-side IGBT 18 and an NW terminal 17 are electrically connected via a main current emitter wire 10. Other configurations are similar to those of the U-phase frame 12.

The lower arm-side MOSFET 19 and the lower arm-side IGBT 18 provided in each of the U-phase frame 12, the V-phase frame 13, and the W-phase frame 14 configure the lower arm of the semiconductor device.

As illustrated in FIGS. 1, 3, an upper arm frame 11 is provided with an upper arm-side MOSFET 6 and an upper arm-side IGBT 8 connected in parallel with the upper arm-side MOSFET 6. The upper arm-side MOSFET 6 and the upper arm-side IGBT 8 are formed of silicon.

The upper arm-side MOSFET 6 is provided with a gate pad 20, and a MOSFET gate wire 4 electrically connects the gate pad 20 and an upper arm-side control IC 3. The upper arm-side IGBT 8 is provided with a gate pad 21, and an IGBT gate wire 5 electrically connects the gate pad 21 and the upper arm-side control IC 3. A source-emitter wire 9 electrically connects a source electrode of the upper arm-side MOSFET 6 and an emitter electrode of the upper arm-side IGBT 8.

An IGBT emitter sense wire 7 electrically connects an emitter electrode of the upper arm-side IGBT 8 and the upper arm-side control IC 3. That is, the source electrode of the upper arm-side MOSFET 6 is electrically connected to the upper arm-side control IC 3 via the source-emitter wire 9, the emitter electrode of the upper arm-side IGBT 8, and the IGBT emitter sense wire 7.

The upper arm frame 11 is provided with three pairs of the upper arm-side MOSFET 6 and the upper arm-side IGBT 8. The emitter electrode of the upper arm-side IGBT 8 in the first pair from the right in FIG. 1 is electrically connected to the U-phase frame 12 via a main current emitter wire 10. The emitter electrode of the upper arm-side IGBT 8 in the second pair from the right in FIG. 1 is electrically connected to the V-phase frame 13 via a main current emitter wire 10. The emitter electrode of the upper arm-side IGBT 8 in the third pair from the right in FIG. 1 is electrically connected to the W-phase frame 14 via a main current emitter wire 10. In each of the pairs, the source-emitter wire 9 and the main current emitter wire 10 are one continuous wire, and a wire welding point (stitch) is formed at a boundary portion between the source-emitter wire 9 and the main current emitter wire 10 (the emitter electrode of the upper arm-side IGBT 8).

The three pairs of the upper arm-side MOSFET 6 and the upper arm-side IGBT 8 provided in the upper arm frame 11 configure the upper arm of the semiconductor device.

An IC frame 1 is provided with the lower arm-side control IC 2 and the upper arm-side control IC 3. The lower arm-side control IC 2 controls driving of the lower arm-side MOSFETs 19 and the lower arm-side IGBTs 18. The upper arm-side control IC 3 controls driving of the upper arm-side MOSFETs 6 and the upper arm-side IGBTs 8.

The upper arm-side MOSFET 6 and the lower arm-side MOSFET 19 are smaller in chip size than the upper arm-side IGBT 8 and the lower arm-side IGBTs 18, and are provided closer to the lower arm-side control IC 2 and the upper arm-side control IC 3 than the upper arm-side IGBT 8 and the lower arm-side IGBT 18.

The MOSFET gate wire 4, the IGBT gate wire 5, and the IGBT emitter sense wire 7 are thin wires, and are, for example, gold wires, silver wires, or copper wires each having a wire diameter (a diameter of a cross section of the wire) of 20 to 50 μm.

The source-emitter wire 9 and the main current emitter wire 10 are thick wires, for example, aluminum wires each having a wire diameter of 200 μm.

The emitter electrode of the upper arm-side IGBT 8 and the upper arm-side control IC 3 are directly connected by the IGBT emitter sense wire 7, by which a gate voltage drop due to a negative feedback effect can be induced in the upper arm-side MOSFET 6. By adjusting an inductance of each of the source-emitter wire 9 connecting the source electrode of the upper arm-side MOSFET 6 and the emitter electrode of the upper arm-side IGBT 8 and the source-emitter wire 9 connecting the source electrode of the lower arm-side MOSFET 19 and the emitter electrode of the lower arm-side IGBT 18, it is possible to control the negative feedback effect in the upper arm-side MOSFET 6, suppress a saturation current in the MOSFET (upper arm-side MOSFET 6, lower arm-side MOSFET 19), and shorten a drive period.

By turning on the MOSFET (upper arm-side MOSFET 6, lower arm-side MOSFET 19) having a small capacitance after the IGBT (upper arm-side IGBT 8, lower arm-side IGBT 18) and turning off the MOSFET before the IGBT, short-circuit breakdown of the semiconductor device can be prevented. In addition, since a wiring length of the source-emitter wire 9 and the delay time (turn-on delay time, turn-off delay time) of the control IC can be designed to drive each other, a degree of freedom in design is improved, and characteristics of the MOSFET can be further utilized by shortening the delay time.

The semiconductor device according to the first preferred embodiment is manufactured through at least steps below. That is, a method for manufacturing the semiconductor device according to the first preferred embodiment includes: a step of providing the lower arm-side MOSFET 19; a step of providing the lower arm-side IGBT 18 so as to connect the same in parallel with the lower arm-side MOSFET 19; a step of providing the upper arm-side MOSFET 6; a step of providing the upper arm-side IGBT 8 so as to connect the same in parallel with the upper arm-side IGBT MOSFET 6; a step of providing the upper arm-side control IC 3 that controls driving of the upper arm-side MOSFET 6 and the upper arm-side IGBT 8; a step of providing the MOSFET gate wire 4 that electrically connects the gate electrode of the upper arm-side MOSFET 6 and the upper arm-side control IC 3; a step of providing the IGBT gate wire 5 that electrically connects the gate electrode of the upper arm-side IGBT 8 and the upper arm-side control IC 3; and providing the IGBT emitter sense wire 7 electrically directly connecting the emitter electrode of the upper arm-side IGBT 8 and the upper arm-side control IC 3.

<First Modification>

In the first preferred embodiment, the case where the semiconductor device includes the IGBT has been described, but the present invention is not limited thereto. The semiconductor device may include reverse conducting IGBT (RC-IGBT) instead of the IGBT.

<Second Modification>

In the first preferred embodiment, the case where the MOSFET (upper arm-side MOSFET 6, lower arm-side MOSFET 19) and the IGBT (upper arm-side IGBT 8, lower arm-side IGBT 18) are formed of silicon has been described, but the present invention is not limited thereto. The MOSFET and the IGBT may be formed of a wide band gap semiconductor having a band gap larger than that of silicon. Examples of the wide band gap semiconductor include a silicon carbide, gallium nitride-based material, and diamond.

Second Preferred Embodiment

FIG. 5 is a plan view illustrating a configuration of an upper arm of a semiconductor device according to a second preferred embodiment. Note that in FIG. 5, one of three pairs of the upper arm-side MOSFET 6 and the upper arm-side IGBT 8 configuring the upper arm is illustrated, but the other pairs are similar.

As illustrated in FIG. 5, the source-emitter wire 9 and the main current emitter wire 10 are separated from each other and electrically connected to the emitter electrode of the upper arm-side IGBT 8. That is, the source-emitter wire 9 and the main current emitter wire 10 are separated from each other and connected to the emitter electrode of the upper arm-side IGBT 8 without forming the wire welding point as in the first preferred embodiment (see FIG. 3). Other configurations are similar to those of the first preferred embodiment (see FIG. 3).

By separating the source-emitter wire 9 and the main current emitter wire 10, and connecting them to the emitter electrode of the upper arm-side IGBT 8, a main current path includes a chip surface (a surface of the emitter electrode of the upper arm-side IGBT 8), and thus, a current in a steady state is narrowed by a resistance component of the chip surface.

Since a gate voltage drop due to negative feedback is generated by a steep current change (di/dt), it is possible to limit the current in the steady state other than a transient state as in the first preferred embodiment. This makes it possible to prevent overcurrent breakdown of the semiconductor device in the steady state.

Note that although the upper arm has been described above, the same applies to the lower arm. That is, in the configuration described in the first preferred embodiment (see FIG. 2), the source-emitter wire 9 and the main current emitter wire 10 are separated from each other and electrically connected to the emitter electrode of the lower arm-side IGBT 18. Other configurations are similar to those of the first preferred embodiment (see FIG. 2).

Third Preferred Embodiment

FIG. 6 is a plan view showing a configuration of an upper arm of a semiconductor device according to a third preferred embodiment. Note that in FIG. 6, one of three pairs of the upper arm-side MOSFET 6 and the upper arm-side IGBT 8 configuring the upper arm is illustrated, but the other pairs are similar.

As illustrated in FIG. 6, a MOSFET source wire 30 is electrically connected to the source electrode of the upper arm-side MOSFET 6. Specifically, one end of the MOSFET source wire 30 is connected to the source electrode of the upper arm-side MOSFET 6, and another end is connected to any one of the U-phase frame 12, the V-phase frame 13, and the W-phase frame 14. For example, when the upper arm-side MOSFET 6 and the upper arm-side IGBT 8 are the first pair from the right illustrated in FIG. 1, the other end of the MOSFET source wire 30 is connected to the U-phase frame 12.

In addition, the main current emitter wire 10 is electrically connected to the emitter electrode of the upper arm-side IGBT 8. Specifically, one end of the main current emitter wire 10 is connected to the emitter electrode of the upper arm-side IGBT 8, and another end is connected to the same frame as the MOSFET source wire 30 among the U-phase frame 12, the V-phase frame 13, and the W-phase frame 14. For example, when the other end of the MOSFET source wire 30 is connected to the U-phase frame 12, the other end of the main current emitter wire 10 is also connected to the U-phase frame 12.

As described above, in the third preferred embodiment, the MOSFET source wire 30 is wired from the source electrode of the upper arm-side MOSFET 6, and the main current emitter wire 10 is wired from the emitter electrode of the upper arm-side IGBT 8. Therefore, by adjusting wiring lengths of the MOSFET source wire 30 and the main current emitter wire 10, a difference in inductance between the MOSFET source wire 30 and the main current emitter wire 10 can be generated independently of chip sizes of the MOSFET and the IGBT, and the negative feedback effect is easily obtained.

Note that although the upper arm has been described above, the same applies to the lower arm. That is, in the configuration described in the first preferred embodiment (see FIG. 2), the MOSFET source wire 30 is provided instead of the source-emitter wire 9. Other configurations are similar to those of the first preferred embodiment (see FIG. 2).

Fourth Preferred Embodiment

FIG. 7 is a plan view illustrating a configuration of an upper arm of a semiconductor device according to a fourth preferred embodiment. Note that in FIG. 7, one of three pairs of the upper arm-side MOSFET 6 and the upper arm-side IGBT 8 configuring the upper arm is illustrated, but the other pairs are similar.

As illustrated in FIG. 7, the upper arm-side MOSFET 6 and the upper arm-side IGBT 8 are provided side by side along an extending direction of the upper arm-side control IC 3. With such a configuration, the gate pad 20 provided in the upper arm-side MOSFET 6 and the gate pad 21 provided in the upper arm-side IGBT 8 can be disposed near the upper arm-side control IC 3. Therefore, a length of each of the MOSFET gate wire 4, the IGBT gate wire 5, and the IGBT emitter sense wire 7 can be shortened.

Since a wiring inductance can be reduced by shortening the length of each of the MOSFET gate wire 4, the IGBT gate wire 5, and the IGBT emitter sense wire 7, gate oscillation when the MOSFET and the IGBT are switched and operated can be prevented.

By shortening the length of each of the MOSFET gate wire 4, the IGBT gate wire 5, and the IGBT emitter sense wire 7, it is possible to suppress a wire sweep in a mold implantation process, which is one of manufacturing processes of the semiconductor device, and to improve assemblability.

Note that within the scope of the present disclosure, each of the preferred embodiments can be freely combined, and each of the preferred embodiments can be appropriately modified or omitted.

APPENDIXES

Hereinafter, various aspects of the present disclosure will be collectively described as appendixes.

Appendix 1

A semiconductor device comprising:
a lower arm-side metal-oxide-semiconductor field effect transistor (MOSFET);
a lower arm-side insulated gate bipolar transistor (IGBT) connected in parallel with the lower arm-side MOSFET;
an upper arm-side MOSFET;
an upper arm-side IGBT connected in parallel with the upper arm-side MOSFET;
an upper arm-side control integrated circuit (IC) that controls driving of the upper arm-side MOSFET and the upper arm-side IGBT;
a MOSFET gate wire electrically connecting a gate electrode of the upper arm-side MOSFET and the upper arm-side control IC;
an IGBT gate wire electrically connecting a gate electrode of the upper arm-side IGBT and the upper arm-side control IC; and

7 an IGBT emitter sense wire electrically directly connecting an emitter electrode of the upper arm-side IGBT and the upper arm-side control IC, wherein a source electrode of the upper arm-side MOSFET is electrically connected to the upper arm-side control IC via the emitter electrode of the upper arm-side IGBT.

Appendix 2

The semiconductor device according to Appendix 1, further comprising:

a source-emitter wire electrically connecting the source electrode of the upper arm-side MOSFET and the emitter electrode of the upper arm-side IGBT; and a main current emitter wire electrically connected to the emitter electrode of the upper arm-side IGBT while being separated from the source-emitter wire.

Appendix 3

The semiconductor device according to Appendix 1, further comprising:

a source-emitter wire electrically connecting a source electrode of a lower arm-side MOSFET and an emitter electrode of a lower arm-side IGBT; and a main current emitter wire electrically connected to the emitter electrode of the lower arm-side IGBT while being separated from the source-emitter wire.

Appendix 4

The semiconductor device according to Appendix 1, further comprising:

a MOSFET source wire electrically connected to the source electrode of the upper arm-side MOSFET; and a main current emitter wire electrically connected to the emitter electrode of the upper arm-side IGBT.

Appendix 5

The semiconductor device according to Appendix 1, further comprising:

a MOSFET source wire electrically connected to a source electrode of the lower arm-side MOSFET; and a main current emitter wire electrically connected to an emitter electrode of the lower arm-side IGBT.

Appendix 6

The semiconductor device according to Appendix 1, wherein the upper arm-side MOSFET and the upper arm-side IGBT are provided side by side along an extending direction of the upper arm-side control IC.

Appendix 7

The semiconductor device according to Appendix 1, wherein the upper arm-side MOSFET is provided closer to the upper arm-side control IC than the upper arm-side IGBT.

Appendix 8

The semiconductor device according to Appendix 2, wherein a diameter of the IGBT emitter sense wire is smaller than a diameter of the source-emitter wire and a diameter of the main current emitter wire.

Appendix 9

The semiconductor device according to Appendix 1, wherein the lower arm-side MOSFET, the lower arm-side IGBT, the upper arm-side MOSFET, and the upper arm-side IGBT are each formed of a wide band gap semiconductor.

Appendix 10

A method of manufacturing a semiconductor device, comprising the steps of:

providing a lower arm-side metal-oxide-semiconductor field effect transistor (MOSFET);

providing a lower arm-side insulated gate bipolar transistor (IGBT) so as to connect the same in parallel with the lower arm-side MOSFET;

providing an upper arm-side MOSFET;

providing an upper arm-side IGBT so as to connect the same in parallel with the upper arm-side MOSFET;

providing an upper arm-side control integrated circuit (IC) that controls driving of the upper arm-side MOSFET and the upper arm-side IGBT;

providing a MOSFET gate wire electrically connecting a gate electrode of the upper arm-side MOSFET and the upper arm-side control IC;

providing an IGBT gate wire electrically connecting a gate electrode of the upper arm-side IGBT and the upper arm-side control IC; and providing an IGBT emitter sense wire electrically directly connecting an emitter electrode of the upper arm-side IGBT and the upper arm-side control IC, wherein a source electrode of the upper arm-side MOSFET is electrically connected to the upper arm-side control IC via the emitter electrode of the upper arm-side IGBT.

While the disclosure has been shown and described in detail, the foregoing description is in all aspects illustrative and not restrictive. It is therefore understood that numerous modifications and variations can be devised.

What is claimed is:

1. A semiconductor device comprising:

a lower arm-side metal-oxide-semiconductor field effect transistor (MOSFET);

a lower arm-side insulated gate bipolar transistor (IGBT) connected in parallel with the lower arm-side MOSFET;

an upper arm-side MOSFET;

an upper arm-side IGBT connected in parallel with the upper arm-side MOSFET;

an upper arm-side control integrated circuit (IC) that controls driving of the upper arm-side MOSFET and the upper arm-side IGBT;

a MOSFET gate wire electrically connecting a gate electrode of the upper arm-side MOSFET and the upper arm-side control IC;

an IGBT gate wire electrically connecting a gate electrode of the upper arm-side IGBT and the upper arm-side control IC; and an IGBT emitter sense wire electrically directly connecting an emitter electrode of the upper arm-side IGBT and the upper arm-side control IC, wherein a source electrode of the upper arm-side MOSFET is electrically connected to the upper arm-side control IC via the emitter electrode of the upper arm-side IGBT.

2. The semiconductor device according to claim 1, further comprising:

a source-emitter wire electrically connecting the source electrode of the upper arm-side MOSFET and the emitter electrode of the upper arm-side IGBT; and a main current emitter wire electrically connected to the emitter electrode of the upper arm-side IGBT while being separated from the source-emitter wire.

3. The semiconductor device according to claim 1, further comprising:

a source-emitter wire electrically connecting a source electrode of the lower arm-side MOSFET and an emitter electrode of the lower arm-side IGBT; and a main current emitter wire electrically connected to the emitter electrode of the lower arm-side IGBT while being separated from the source-emitter wire.

4. The semiconductor device according to claim 1, further comprising:

a MOSFET source wire electrically connected to the source electrode of the upper arm-side MOSFET; and a main current emitter wire electrically connected to the emitter electrode of the upper arm-side IGBT.

5. The semiconductor device according to claim 1, further comprising:

a MOSFET source wire electrically connected a source electrode of the lower arm-side MOSFET; and a main current emitter wire electrically connected to an emitter electrode of the lower arm-side IGBT.

6. The semiconductor device according to claim 1, wherein the upper arm-side MOSFET and the upper arm-side IGBT are provided side by side along an extending direction of the upper arm-side control IC.

7. The semiconductor device according to claim 1, wherein the upper arm-side MOSFET is provided closer to the upper arm-side control IC than the upper arm-side IGBT.

8. The semiconductor device according to claim 2, wherein a diameter of the IGBT emitter sense wire is smaller than a diameter of the source-emitter wire and a diameter of the main current emitter wire.

9. The semiconductor device according to claim 1, wherein the lower arm-side MOSFET, the lower arm-side IGBT, the upper arm-side MOSFET, and the upper arm-side IGBT are each formed of a wide band gap semiconductor.

10. A method of manufacturing a semiconductor device, comprising the steps of:

providing a lower arm-side metal-oxide-semiconductor field effect transistor (MOSFET);

providing a lower arm-side insulated gate bipolar transistor (IGBT) so as to connect the same in parallel with the lower arm-side MOSFET;

providing an upper arm-side MOSFET;

providing an upper arm-side IGBT so as to connect the same in parallel with the upper arm-side MOSFET;

providing an upper arm-side control integrated circuit (IC) that controls driving of the upper arm-side MOSFET and the upper arm-side IGBT;

providing a MOSFET gate wire electrically connecting a gate electrode of the upper arm-side MOSFET and the upper arm-side control IC;

providing an IGBT gate wire electrically connecting a gate electrode of the upper arm-side IGBT and the upper arm-side control IC; and providing an IGBT emitter sense wire electrically directly connecting an emitter electrode of the upper arm-side IGBT and the upper arm-side control IC, wherein a source electrode of the upper arm-side MOSFET is electrically connected to the upper arm-side control IC via the emitter electrode of the upper arm-side IGBT.

* * * * *